(12) United States Patent
Nowak et al.

(10) Patent No.: US 6,888,199 B2
(45) Date of Patent: May 3, 2005

(54) HIGH-DENSITY SPLIT-GATE FINFET

(75) Inventors: Edward J. Nowak, Essex Junction, VT (US); BethAnn Rainey, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/605,544

(22) Filed: Oct. 7, 2003

(65) Prior Publication Data

US 2005/0073005 A1 Apr. 7, 2005

(51) Int. Cl.[7] .............................................. H01L 27/08
(52) U.S. Cl. ...................... 257/347; 257/302; 257/303; 257/296; 257/304; 257/330; 257/331; 257/332; 257/410; 257/411; 257/412
(58) Field of Search ................................. 257/302, 303, 257/296, 304, 330, 331, 332, 410, 411, 412, 347, 346, 316, 325, 342, 343

(56) References Cited

U.S. PATENT DOCUMENTS

| | | |
|---|---|---|
| 6,316,296 B1 | 11/2001 | Sakamoto |
| 6,339,002 B1 | 1/2002 | Chan et al. |
| 6,346,446 B1 | 2/2002 | Ritenour |
| 6,413,802 B1 | 7/2002 | Hu et al. |
| 6,433,609 B1 | 8/2002 | Voldman |
| 6,483,156 B1 | 11/2002 | Adkisson et al. |
| 6,492,212 B1 | 12/2002 | Ieong et al. |
| 6,504,201 B1 | 1/2003 | Noble et al. |
| 6,580,124 B1 * | 6/2003 | Cleeves et al. ............. 257/331 |
| 2002/0093053 A1 | 7/2002 | Chan et al. |
| 2002/0098657 A1 | 7/2002 | Alavi et al. |
| 2002/0105039 A1 | 8/2002 | Hanafi et al. |

* cited by examiner

*Primary Examiner*—Nathan J. Flynn
*Assistant Examiner*—Fazli Erdem
(74) *Attorney, Agent, or Firm*—McGinn & Gibb, PLLC; William D. Sabo, Esq.

(57) ABSTRACT

Disclosed is a method and structure for forming a split-gate fin-type field effect transistor (FinFET). The invention produces a split-gate fin-type field effect transistor (FinFET) that has parallel fin structures. Each of the fin structures has a source region at one end, a drain region at the other end, and a channel region in the middle portion. Back gate conductors are positioned between channel regions of alternating pairs of the fin structures and front gate conductors are positioned between channel regions of opposite alternating pairs of the fin structures. Thus, the back gate conductors and the front gate conductors are alternatively interdigitated between channel regions of the fin structures.

21 Claims, 16 Drawing Sheets

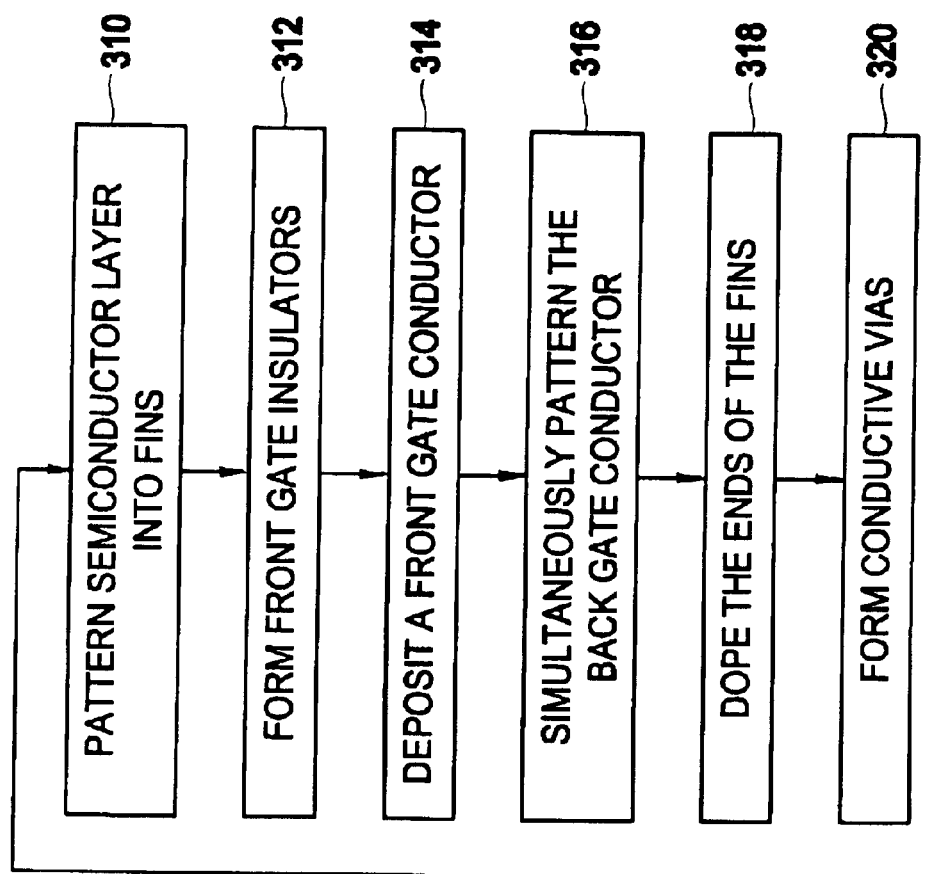
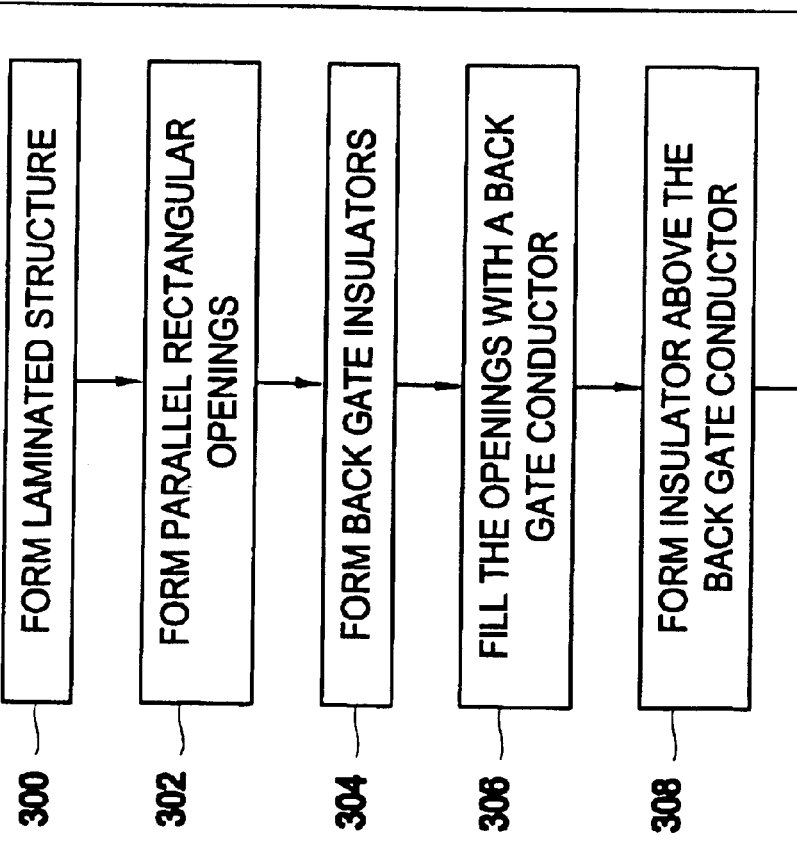
FIG.31

HIGH-DENSITY SPLIT-GATE FINFET

BACKGROUND OF INVENTION

1. Field of the Invention

The present invention generally relates to transistors and more particularly to a fin-type field effect transistor (FinFET) that has a front gate and a back gate.

2. Description of the Related Art

The back-gated complementary metal oxide semiconductor (CMOS) is a known means of achieving threshold voltage (Vt) control without the use of doping. Most structures that allow a back gate rely on burying a gate under an silicon-on-insulator (SOI) silicon layer. As a result, the front and back gates are very difficult to align to one another and to the source drain edges. Furthermore, the gate dielectric for the back gate is very limited by processes that construct such a structure to high-temperature materials such as silicon dioxide. It is desirable for the back gate to also be made of a low resistivity material such as tungsten, which makes for fairly thick values of back gate dielectric for good integrity electrically.

SUMMARY OF INVENTION

This invention introduces a structure of split gate FinFETs which allow for dense connections for the two gates with an arbitrary numbers of fins. This is done by burying a layer for interconnection of the "back" gate beneath an SOI layer and using sidewall image transfer (SIT) to provide a self-aligned means of wiring the two gates in an interdigitated fashion.

More specifically, the invention provides a method of forming a split-gate fin-type field effect transistor (FinFET). The invention starts with a laminated structure (having a semiconductor layer) and patterns parallel rectangular openings in the semiconductor layer. This forms the openings through an insulator layer below the semiconductor layer to a back gate wiring layer below the insulator layer in the laminated structure.

The invention forms back gate insulators on exposed portions of the semiconductor layer within the openings, and then fills the openings with a back gate conductor. Another insulator is formed above the back gate conductor. This insulator electrically separates the back gate conductors from the front gate conductor. The semiconductor layer is patterned into fins, such that a fin is positioned adjacent each side of the back gate conductors. This patterning process leaves one side of each fin exposed (e.g., the side that is opposite the back gate conductor). Next, the invention forms front gate insulators on exposed portions of the fins and then deposits a front gate conductor(s) over the exposed portions of the fins and the insulators. This leaves each fin with a front gate on one side of the fin and a back gate on the other side of the fin.

The invention simultaneously patterns the back gate conductors and the front gate conductor into linear gate conductors intersecting the fins. This process of patterning the back and front gate conductors is selective to the fins, such that ends of the fins are exposed after the patterning process. This process of simultaneously patterning the back gate conductors and the front gate conductor automatically aligns the back gate conductors with the front gate conductor.

The invention then dopes the ends of the fins to form source and drain regions and forms conductive vias to the front gate conductor(s) (or to a front gate wiring layer) and to a back gate wiring layer (or to a well region electrically connected to the back gate conductors). The laminated structure comprises a silicon-on-insulator (SOI) and the back gate conductor controls the threshold voltage level of the FinFET.

Thus, the invention produces a split-gate fin-type field effect transistor (FinFET) that has parallel fin structures. Each of the fin structures has a source region at one end, a drain region at the other end, and a channel region in the middle portion. Back gate conductors are positioned between channel regions of alternating pairs of the fin structures and front gate conductors are positioned between channel regions of opposite alternating pairs of the fin structures. Thus, the back gate conductors and the front gate conductors are alternatively interdigitated between channel regions of the fin structures. Also, each of the channel regions has a back gate conductor on one side of each fin structure and a front gate conductor on the other side of the fin structure. The front gate conductors are positioned adjacent to outer sides of channel regions of end fin structures of the split gate FinFET. There are also gate oxides between the back and front gate conductors and the channel regions.

A back gate wiring layer, or well region, is positioned below the fin structures. The back gate wiring layer (or well region) is electrically connected to the back gate conductors. A front gate wiring layer can be positioned above the fin structures. The front gate conductors and the front gate wiring layer can comprise a continuous conductive unitary structure. Such a front gate wiring layer is electrically connected to the front gate conductors. A first conductive via is connected to the back gate wiring layer (or well region), and a second conductive via is connected to the front gate wiring layer/front gate conductor(s). A first insulator layer is positioned between the back gate wiring layer and the front gate conductors and a second insulator layer is positioned between the front gate wiring layer and the back gate conductors.

The invention solves a number of problems associated with SOI structures by providing a multiple-fin FinFET structure that has self-aligned front and back gates. As mentioned previously, the channel regions in SOI structures are placed above insulators and are therefore floating. Thus, it is important to provide a back gate in SOI structures in order to control the voltage level of the channel region which provides threshold voltage of the transistor. The invention utilizes SOI fin channel regions that are electrically insulated above an insulating layer. In order to control the voltage of the fin channel regions, the back gate is placed on one side of the fin channel regions. The front gate is positioned on the other side of the fin channel regions.

The front and back gates are patterned simultaneously (e.g., in the same process using the same mask) which provides that the front and back gates will be naturally (automatically) aligned with each other. The front and back gates are also used to control the doping of the source/drain regions 112 (wherein the channel region 114 is protected) which also allows the gates to be easily and accurately aligned with the source/drain regions.

Thus, this method provides a structure that has front and back gates that are self-aligned with one another and with the source/drain regions. This allows the back gate to control the threshold voltage of transistors even for structures that utilize multiple fins. With such self-alignment, the power and delay is substantially decreased and the density of transistors is increased, leading to reduced costs.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The foregoing and other objects, aspects and advantages will be better understood from the following detailed description of a preferred embodiment(s) of the invention with reference to the drawings, in which:

FIG. 31 is a flow diagram illustrating a preferred method of the invention.

DETAILED DESCRIPTION

Figure 1:
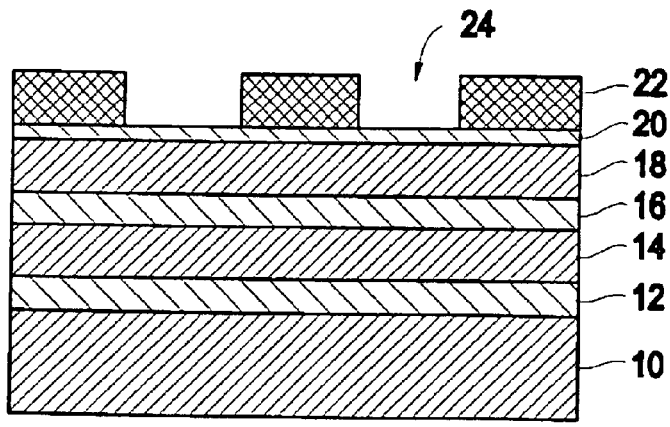
FIG. 1 is a cross-sectional schematic diagram of a partially completed FinFET structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail.

FIG. 1 shows the SOI wafer prepared using known techniques (e.g., wafer bonding) etc. To start with illustrated are a layer (beginning at the bottom) of substrate Si (10), a first buried oxide (12), buried bottom gate (polysilicon or silicide or tungsten or a combination thereof, 14), second buried oxide (16), active silicon (more generally, a semiconductor, 18), and pad films 20 (typically silicon nitride/oxide stack). FIG. 1 also shows the etch mask 22 on top of the entire stack that is patterned 24.

Figure 2:
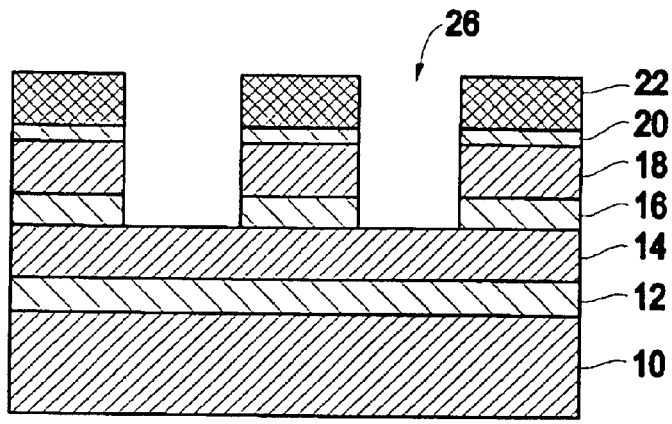
FIG. 2 is a cross-sectional schematic diagram of a partially completed FinFET structure according to the invention.
Figure 3:
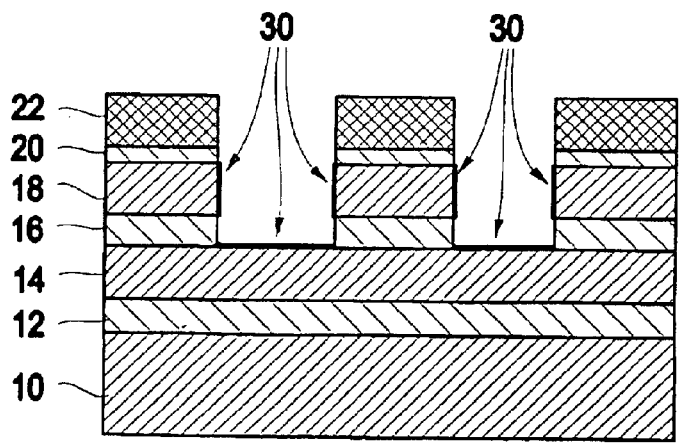
FIG. 3 is a cross-sectional schematic diagram of a partially completed FinFET structure according to the invention.
Figure 4:
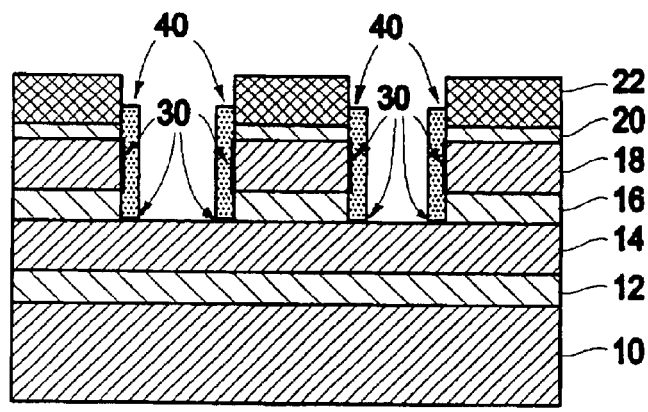
FIG. 4 is a cross-sectional schematic diagram of a partially completed FinFET structure according to the invention.

FIG. 2 shows the openings 26 created by etching through the pad films 20, active silicon 18, buried oxide 16, stopping on or within the buried gate layer 14. FIG. 3 shows a gate oxidation 30 on the sidewalls of the active silicon 18 and the gate layer 14; alternatively the gate oxide can be any suitable gate insulator, such as hafnium silicate, or zirconium dioxide. FIG. 4 shows a spacer 40 of gate electrode material (polysilicon or tungsten, etc.) formed using conventional spacer techniques.

Figure 5:
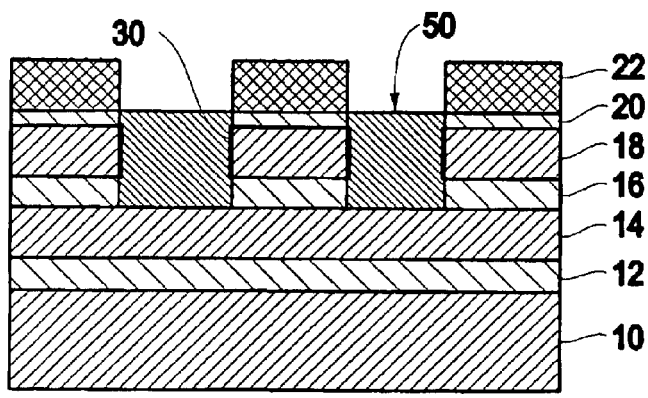
FIG. 5 is a cross-sectional schematic diagram of a partially completed FinFET structure according to the invention.
Figure 6:
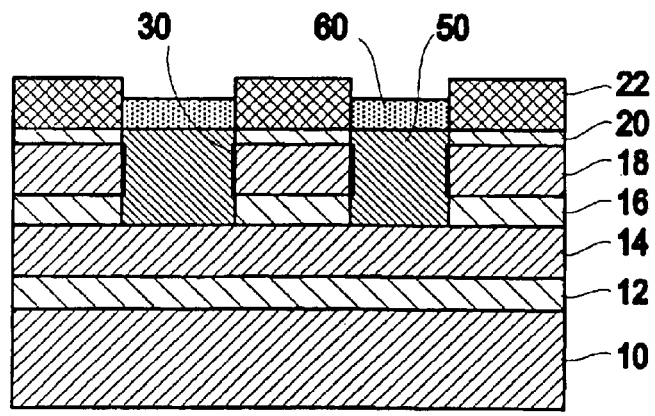
FIG. 6 is a cross-sectional schematic diagram of a partially completed FinFET structure according to the invention.
Figure 7:
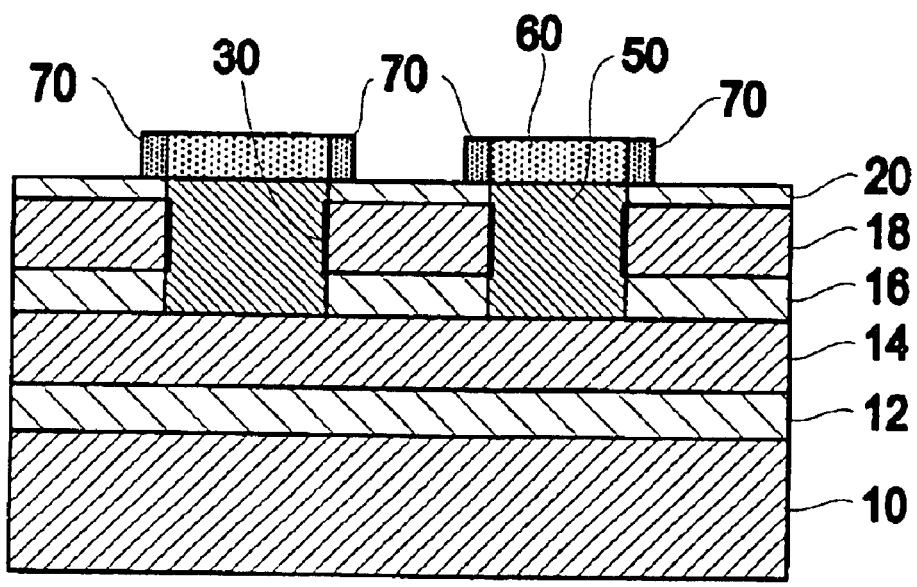
FIG. 7 is a cross-sectional schematic diagram of a partially completed FinFET structure according to the invention.
Figure 8:
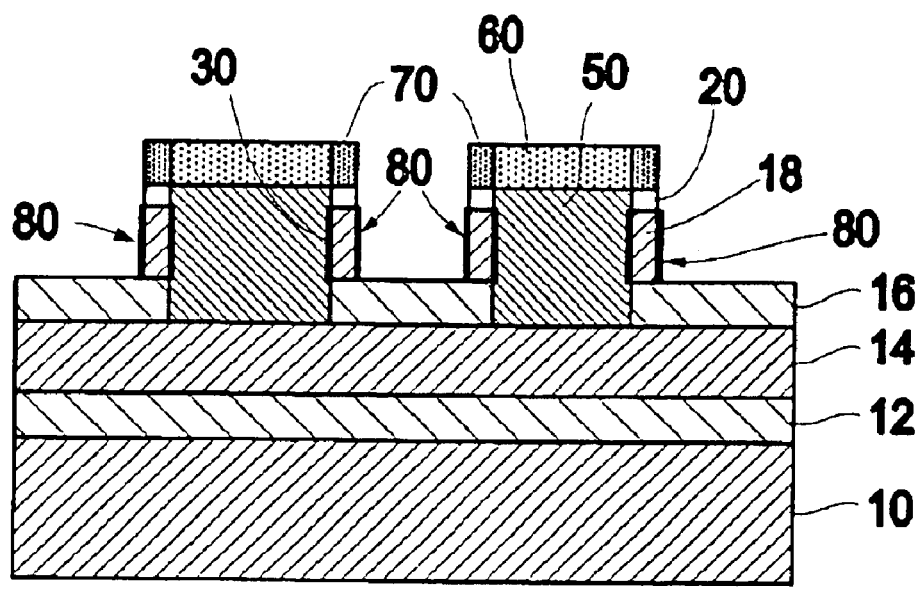
FIG. 8 is a cross-sectional schematic diagram of a partially completed FinFET structure according to the invention.
Figure 9:
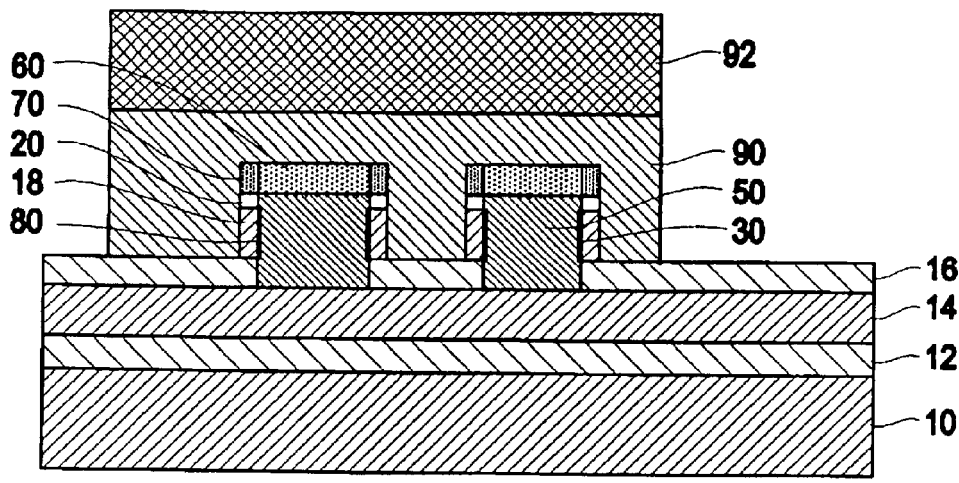
FIG. 9 is a cross-sectional schematic diagram of a partially completed FinFET structure according to the invention.

FIG. 5 shows a gate material 50 deposited, planarized and etched back to recess the electrodes below the top dielectric 22. A deposited dielectric 60 which is planarized and etched back below the top dielectric 22 is shown in FIG. 6. FIG. 7 shows the removal of the top dielectric 22 followed by formation of the spacer 70 on the resultant exposed fill dielectric 60. As shown in FIG. 8, the resultant structure after the pad films 20 and active silicon 18 are etched with the dielectrics 60 and 70 used as a mask. A sacrificial oxidation, strip and gate oxide 80 formation follows. FIG. 9 shows the deposition of the second gate electrode material 90 followed by planarization and patterning using mask 92.

Figure 10:
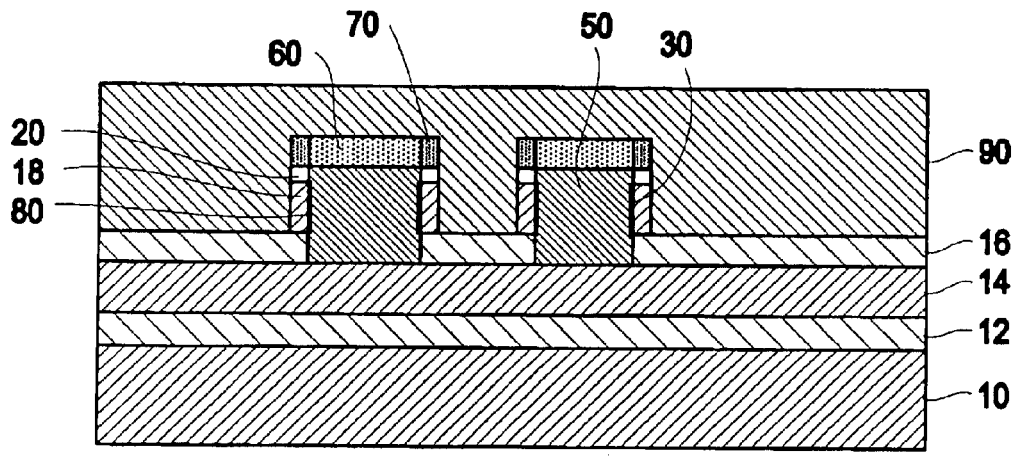
FIG. 10 is a cross-sectional schematic diagram of a partially completed FinFET structure according to the invention.
Figure 11:
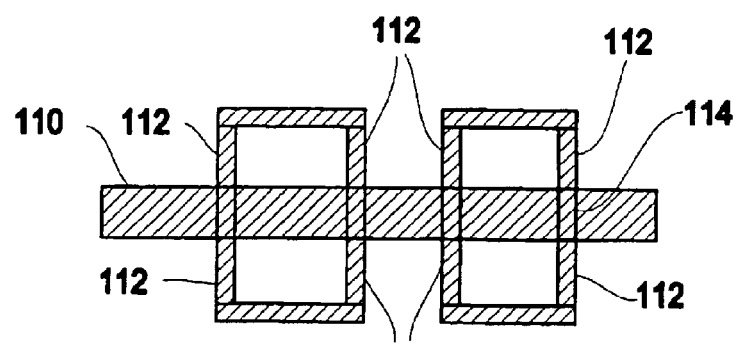
FIG. 11 is a cross-sectional schematic diagram of a partially completed FinFET structure according to the invention.
Figure 12:
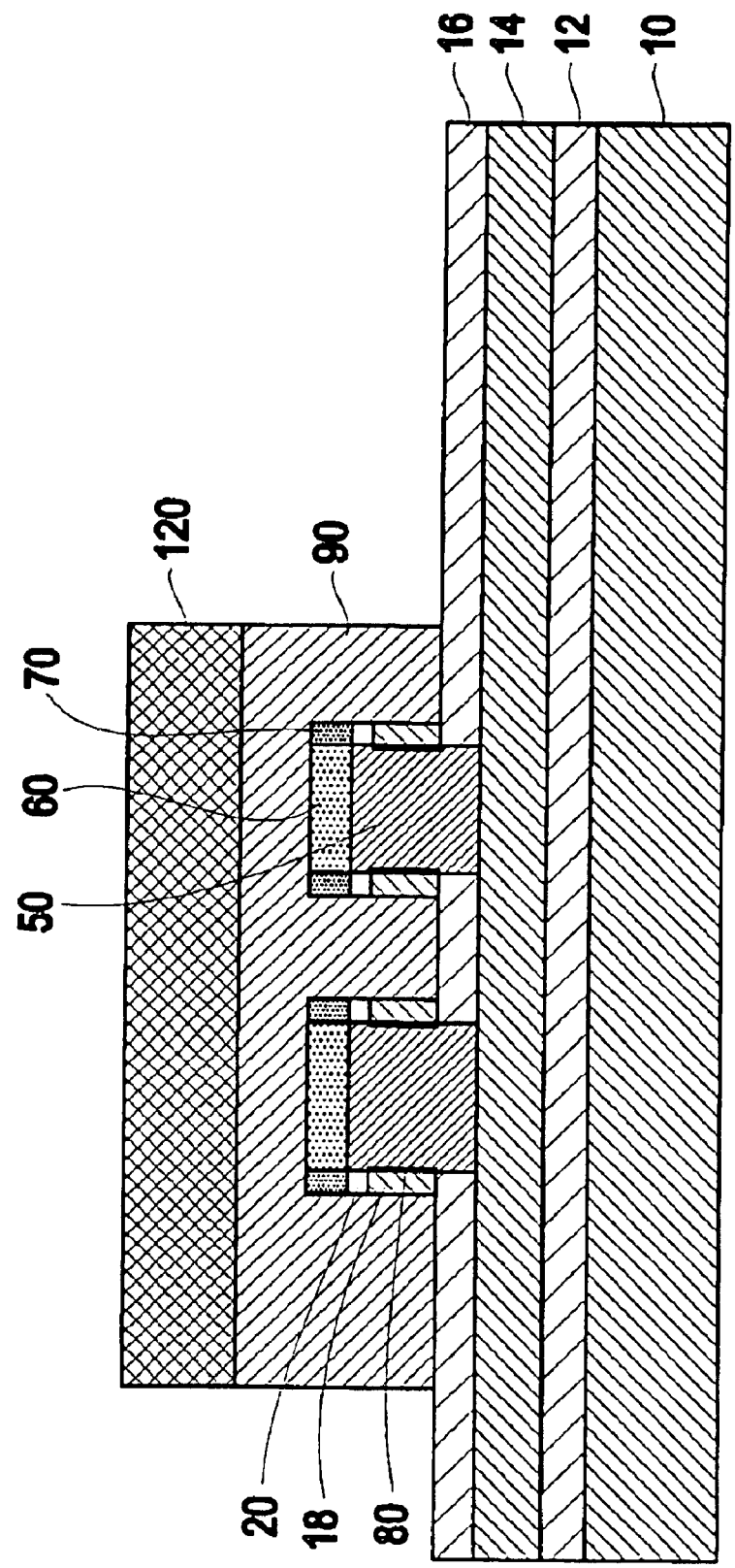
FIG. 12 is a cross-sectional schematic diagram of a partially completed FinFET structure according to the invention.
Figure 13:
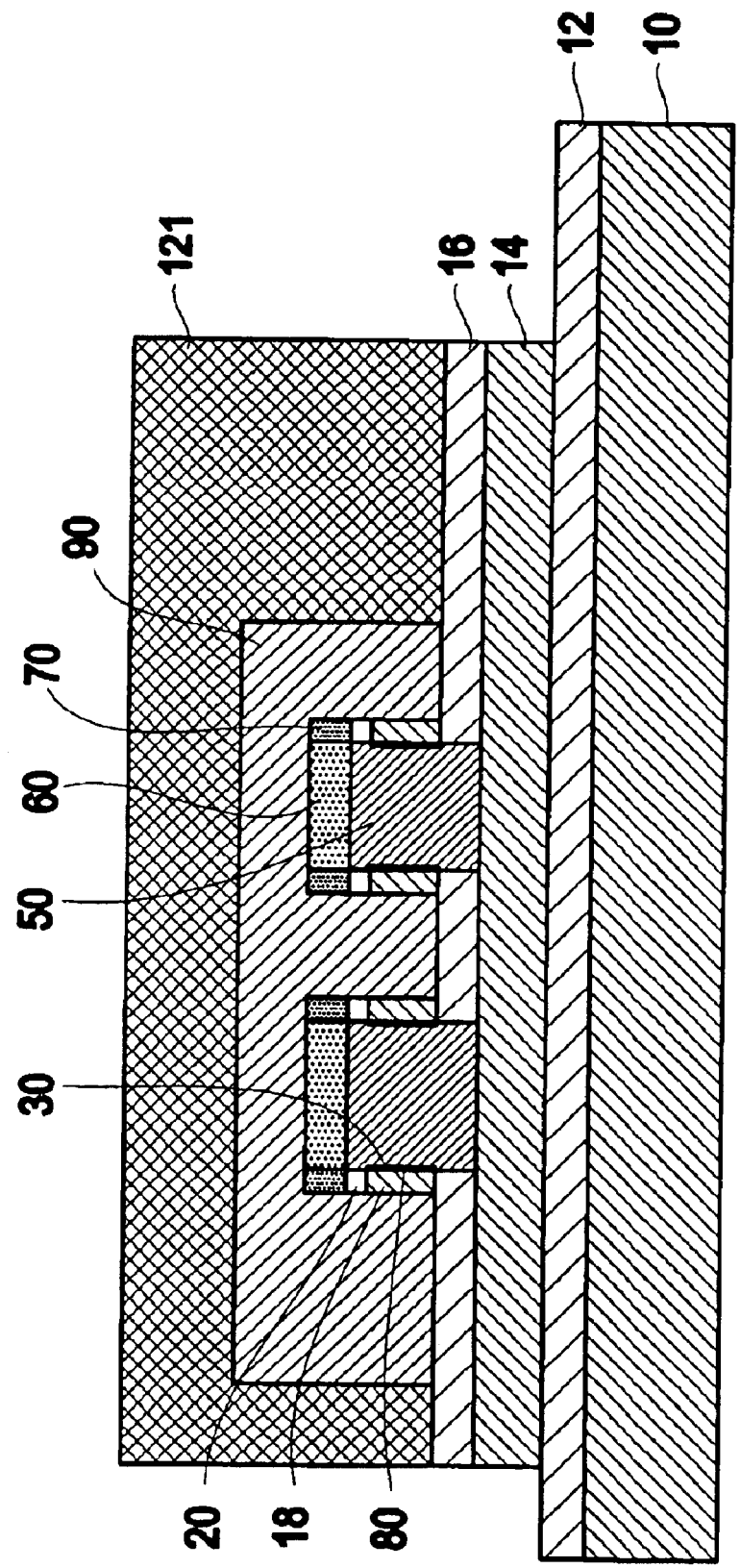
FIG. 13 is a cross-sectional schematic diagram of a partially completed FinFET structure according to the invention.
Figure 14:
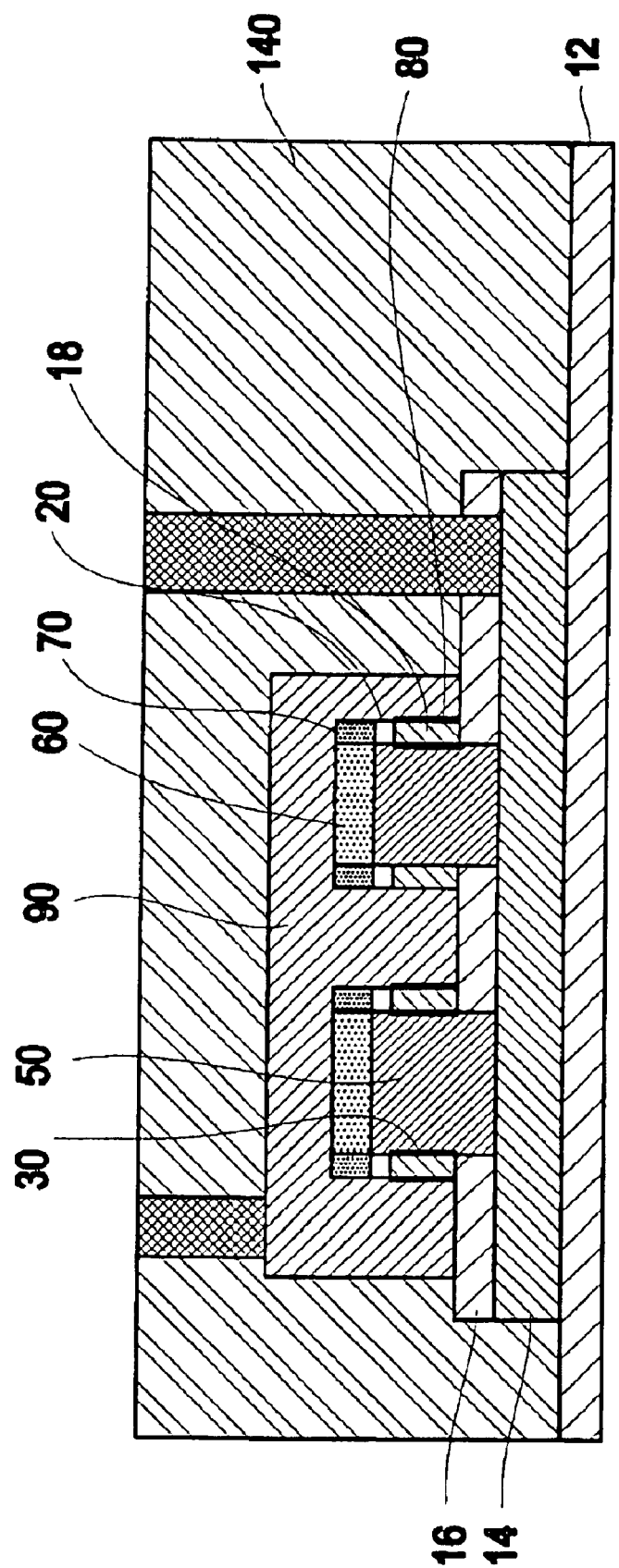
FIG. 14 is a cross-sectional schematic diagram of a partially completed FinFET structure according to the invention.
Figure 15:
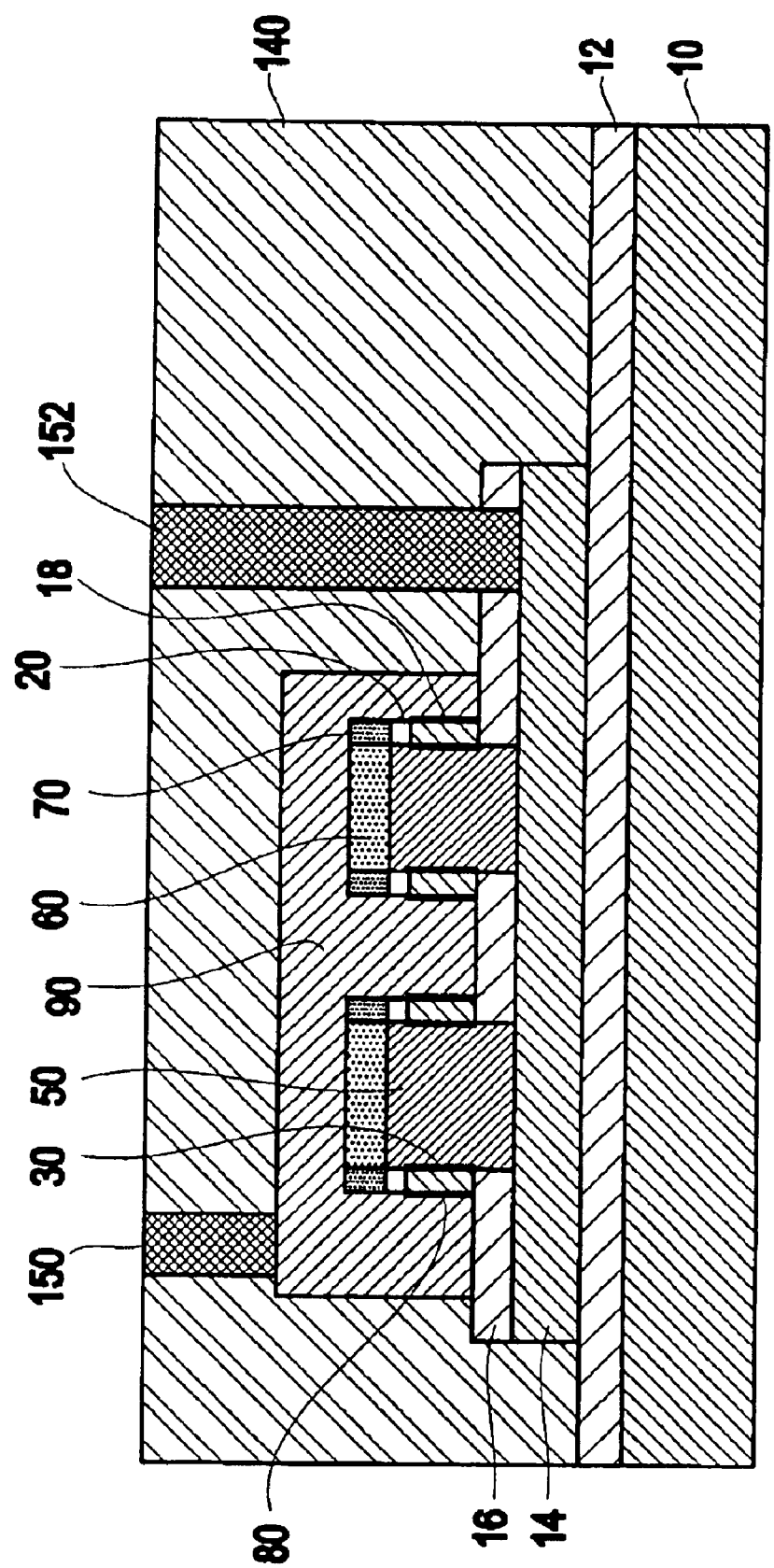
FIG. 15 is a cross-sectional schematic diagram of a partially completed FinFET structure according to the invention.

As shown in FIGS. 10 and 11, respectively, the cross-sectional and top-down views of photoresist patterning for the gate are followed by etching. The etch is selective to $SiO_2$ and etches the second gate electrode material 90 and the first gate electrode material 50, as well as the fill dielectric 60. Hence the first gate 50 edge is self-aligned to the second gate 90 edge because both are etched in the same process using the same mask. FIG. 12 shows the patterned resist 120 and the etched gate electrodes, with the bottom oxide exposed where the gate material has been removed. In FIG. 13 the patterned resist in FIG. 12, 120, is stripped, and a subsequent resist 121 is used to pattern bottom oxide 16, and bottom gate conductor 17. In FIG. 14 the resist 121, of FIG. 13 is also stripped, followed by inter-layer dielectric (ILD)140 deposition and planarization. FIG. 15 shows the complete structure with conductive vias 150, 152 to contact the first and second gates.

Figure 16:
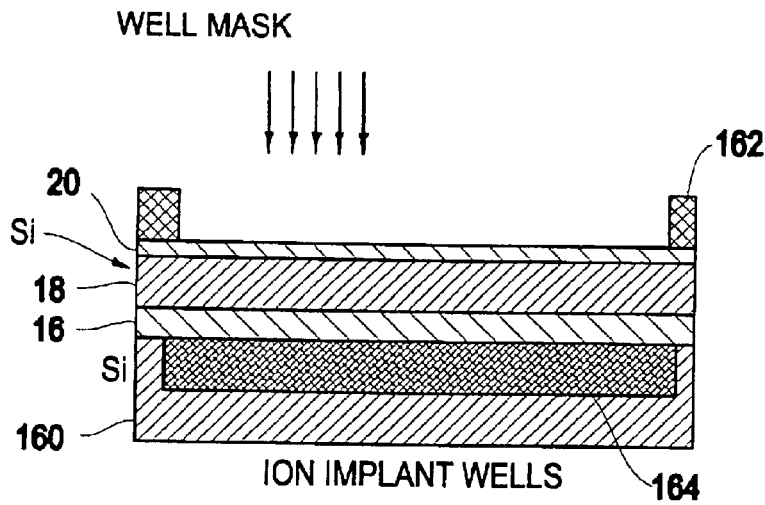
FIG. 16 is a cross-sectional schematic diagram of a partially completed FinFET structure according to the invention.

FIG. 16 illustrates a second embodiment that includes a conductive well region 164 within a silicon layer 160 that is used in place of the substrate 10, oxide 12, and bottom gate 14 in the laminate shown in FIG. 1. The well 164 is formed by implanting impurities through the mask 162. Formation of the well region 164 is less expensive than forming the separate wiring layer 14 that is discussed in the previous example. While this embodiment lowers the cost when compared to previous embodiment, it also increases resistance because the well region 164 has higher resistance than the wiring layer 14. Thus, if the primary concern is cost, the well region 164 would be utilized however, if the primary concern is performance, the wiring layer 14 should be utilized. The processing shown in the remaining drawings (FIGS. 17–31) is somewhat similar to the processing performed on the laminate shown in FIG. 1 and the same numbers are reused in FIGS. 17–31 for the same structures/processes.

Figure 17:
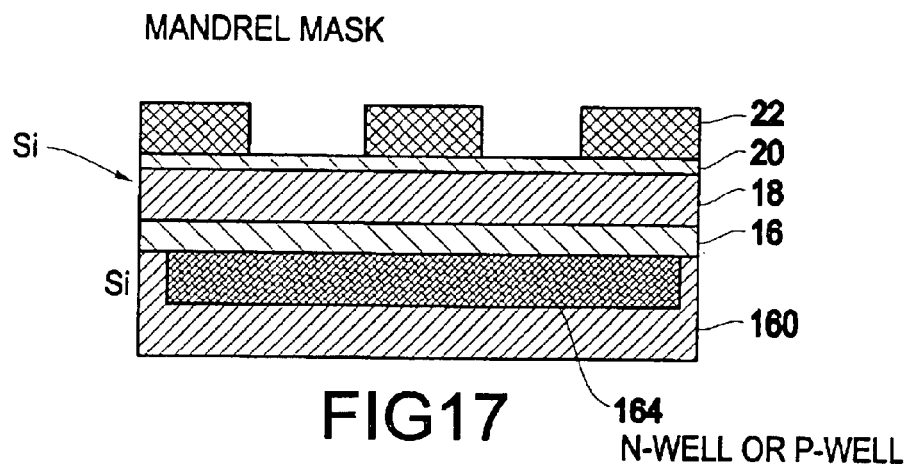
FIG. 17 is a cross-sectional schematic diagram of a partially completed FinFET structure according to the invention.
Figure 18:
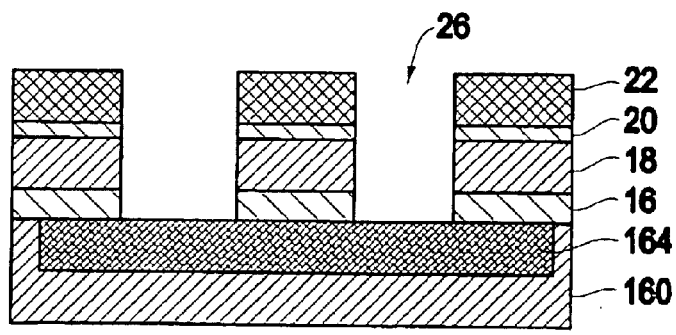
FIG. 18 is a cross-sectional schematic diagram of a partially completed FinFET structure according to the invention.
Figure 19:
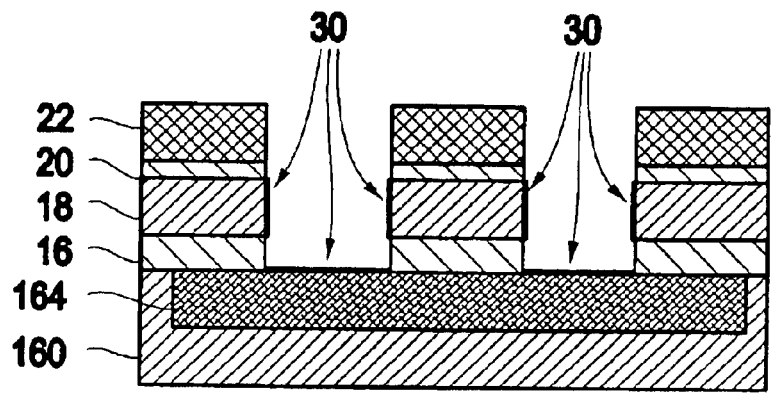
FIG. 19 is a cross-sectional schematic diagram of a partially completed FinFET structure according to the invention.
Figure 20:
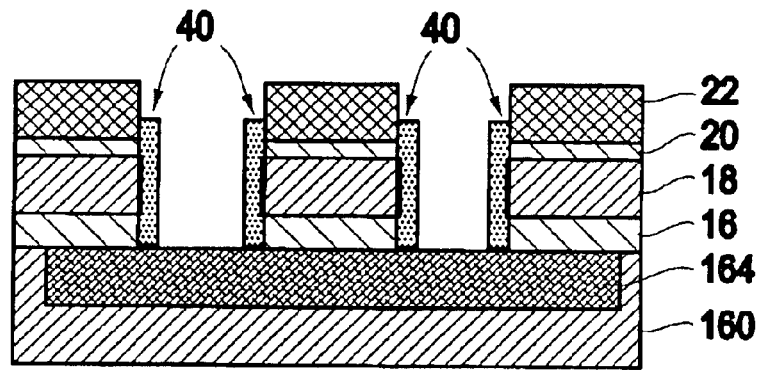
FIG. 20 is a cross-sectional schematic diagram of a partially completed FinFET structure according to the invention.

More specifically, FIG. 17 shows the structure after removal of mask 162 and formation and patterning of mask 22. FIG. 18 shows the openings 26 created by etching through the pad films 20, active silicon 18, and buried oxide 16, stopping on or within the well region 164. FIG. 19 shows a gate oxidation (or alternatively, deposition of a gate dielectric such as hafnium silicate, or zirconium dioxide) 30 on the sidewalls of the active silicon 18 and the well region 164. FIG. 20 shows a spacer 40 of gate electrode material (polysilicon or tungsten, etc.) formed using conventional spacer techniques.

Figure 21:
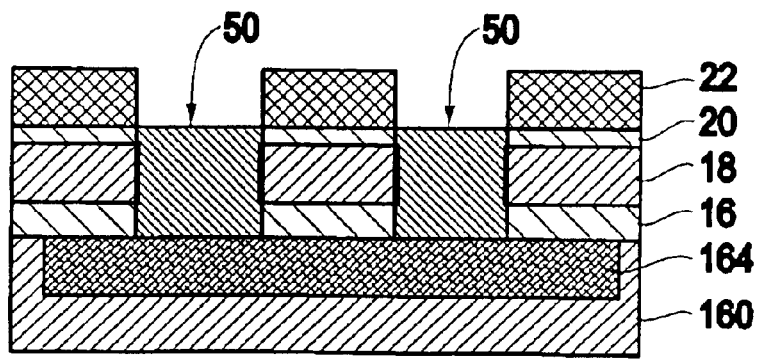
FIG. 21 is a cross-sectional schematic diagram of a partially completed FinFET structure according to the invention.
Figure 22:
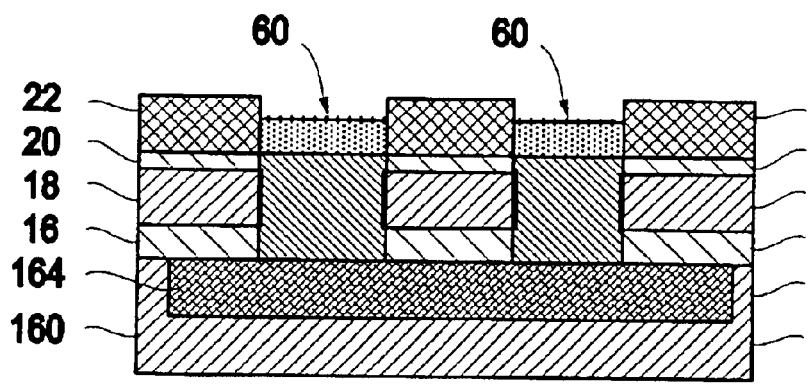
FIG. 22 is a cross-sectional schematic diagram of a partially completed FinFET structure according to the invention.
Figure 23:
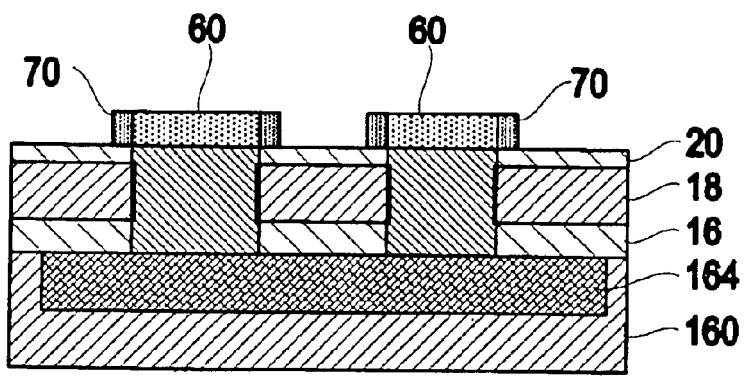
FIG. 23 is a cross-sectional schematic diagram of a partially completed FinFET structure according to the invention.
Figure 24:
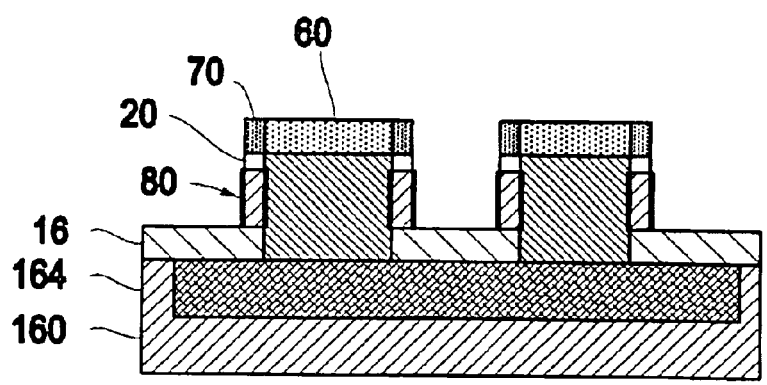
FIG. 24 is a cross-sectional schematic diagram of a partially completed FinFET structure according to the invention.
Figure 25:
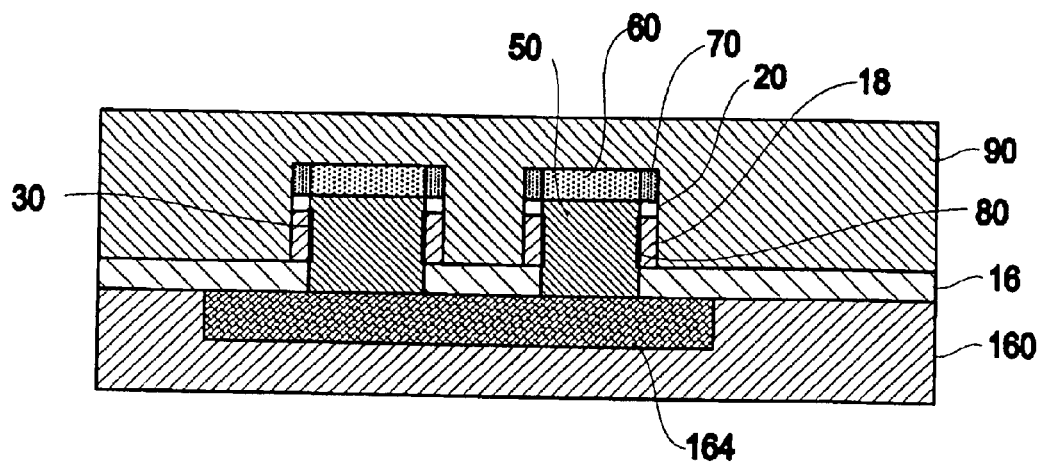
FIG. 25 is a cross-sectional schematic diagram of a partially completed FinFET structure according to the invention.

FIG. 21 shows a gate material 50 deposited, planarized and etched back to recess the electrodes below the top dielectric 22. A deposited dielectric 60 which is planarized and etched back below the top dielectric 22 is shown in FIG. 22. FIG. 23 shows the removal of the top dielectric 22 followed by formation of the spacer 70 on the resultant exposed fill dielectric 60. As shown in FIG. 24, the resultant structure after the hardmask 20 and active silicon 18 are etched with the fill dielectric 70 used as a mask. A sacrificial oxidation, strip and gate oxide (or alternatively, deposition of a gate dielectric such as hafnium silicate, or zirconium dioxide) 80 formation follows. FIG. 25 shows the deposition of the second gate electrode material 90 followed by planarization. Patterning using mask 92 is shown in FIG. 26.

Figure 26:
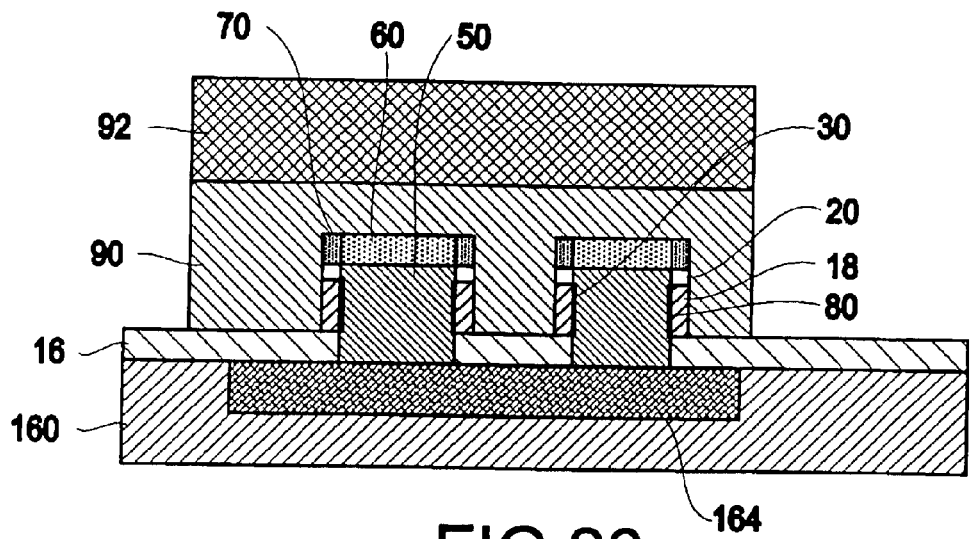
FIG. 26 is a cross-sectional schematic diagram of a partially completed FinFET structure according to the invention.
Figure 27:
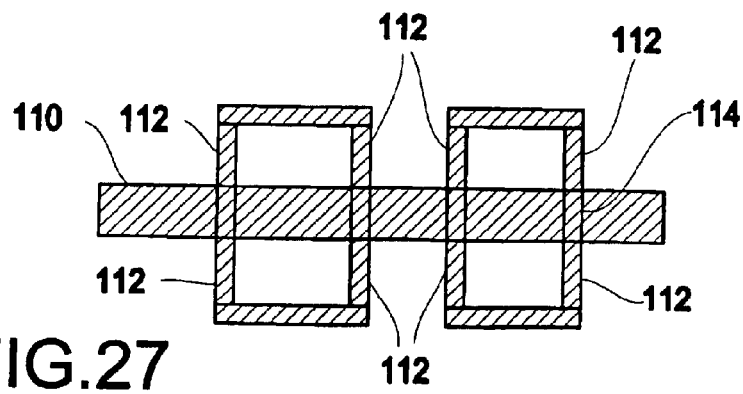
FIG. 27 is a cross-sectional schematic diagram of a partially completed FinFET structure according to the invention.
Figure 28:
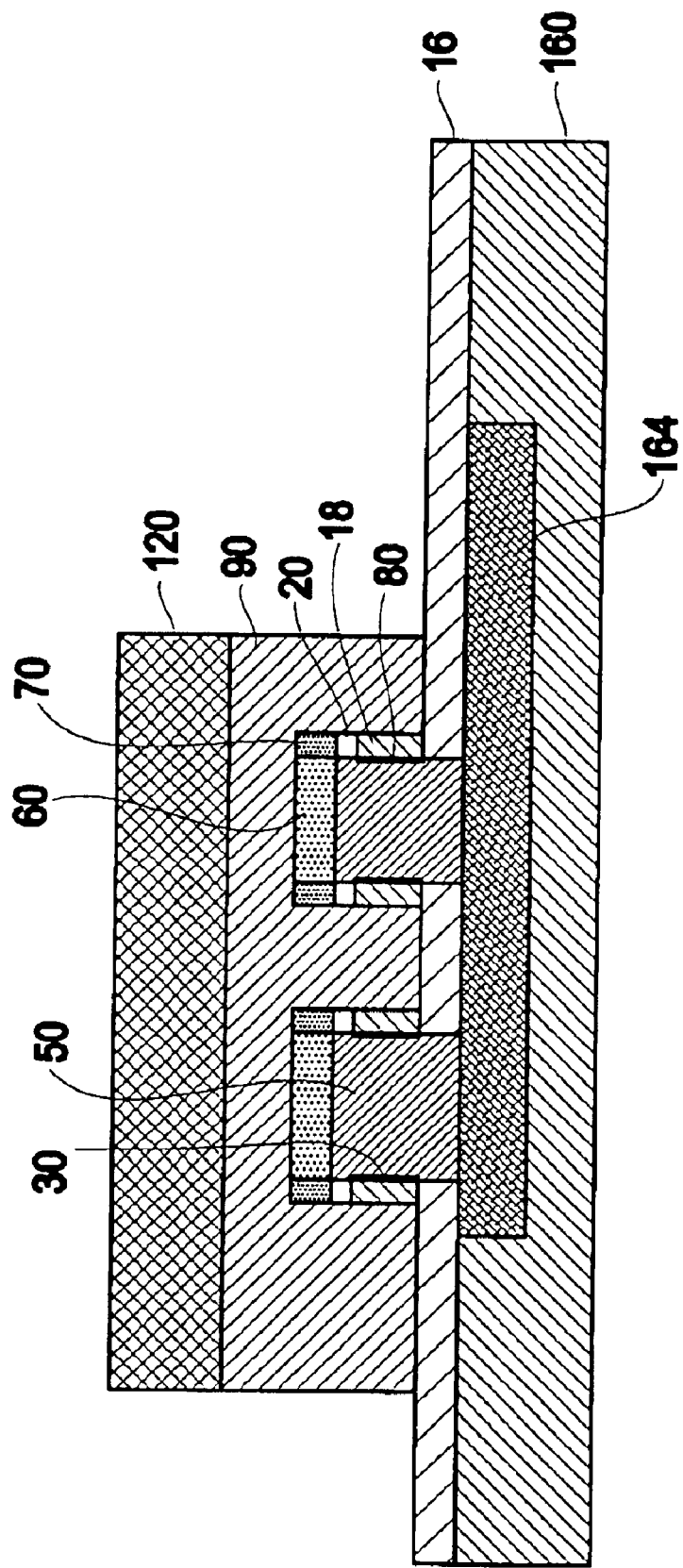
FIG. 28 is a cross-sectional schematic diagram of a partially completed FinFET structure according to the invention.
Figure 29:
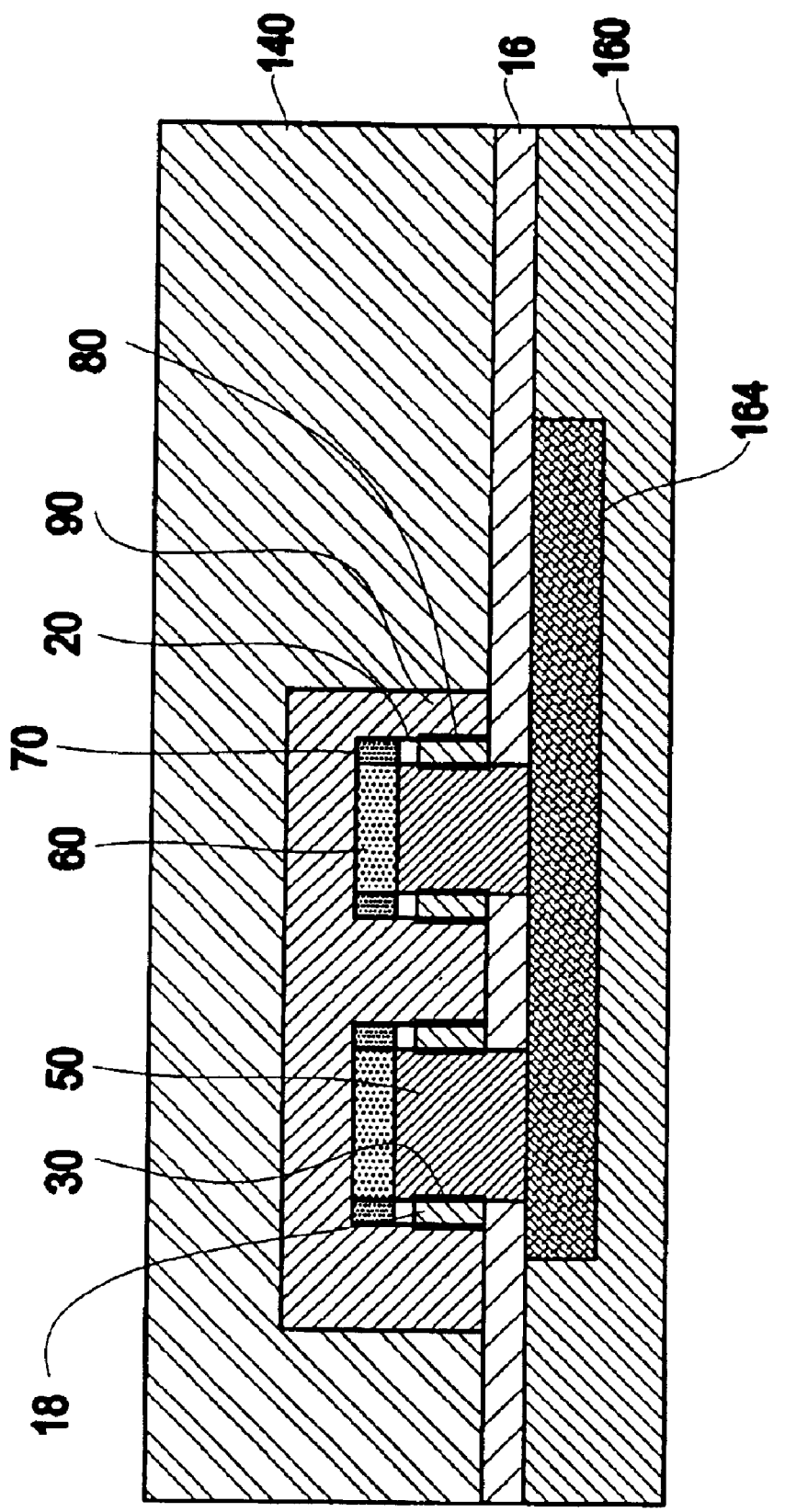
FIG. 29 is a cross-sectional schematic diagram of a partially completed FinFET structure according to the invention.
Figure 30:
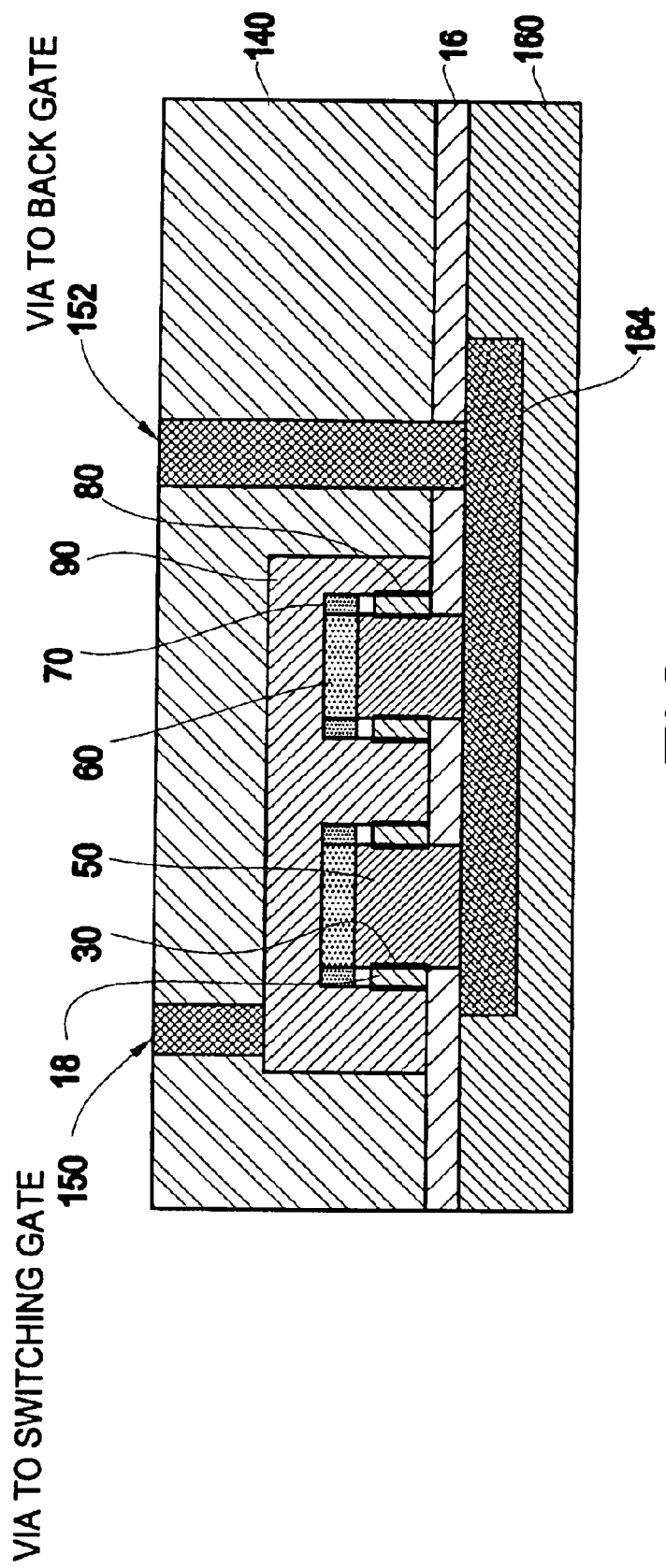
FIG. 30 is a cross-sectional schematic diagram of a partially completed FinFET structure according to the invention.

As shown in FIGS. 26 and 27, respectively, the cross-sectional and top-down views of photoresist patterning for the gate are followed by etching. The etch is selective to SiO2 and etches the second gate electrode material 90 and the first gate electrode material 50, as well as the fill dielectric 60. Hence the first gate 50 edge is self-aligned to the second gate 90 edge because both are etched in the same process using the same mask. FIG. 28 shows the patterned resist 120 and etch of the top buried oxide (BOX) 16 as well as the exposed first gate electrode 50. FIG. 29 shows the resist 120 from FIGS. 28 and 29 stripped, followed by inter-layer dielectric (ILD)140 deposition and planarization. FIG. 30 shows the complete structure with conductive vias 150, 152 to contact the first gate and well region 164.

FIG. 31 is a flowchart representation of the invention and begins with item 300, where the laminated structure (either FIG. 1 or 17) is provided/formed. Next, as shown in item 302, parallel rectangular openings 26 are formed in the semiconductor layer 18. This forms the openings 26 through the insulator layer 16 below the semiconductor layer 18 to either the back gate wiring layer 14 or the well region 164 below the insulator layer 18 in the laminated structure.

In item 304, the invention forms back gate insulators 30 on exposed portions of the semiconductor layer 18 within the openings 26, and then fills the openings 26 with a back gate conductor 50 (item 306). Another insulator 60 is formed above the back gate conductor 50 in item 308. This insulator 60 electrically separates the back gate conductors 50 from the front gate conductor 90 that is formed later. In item 310, the semiconductor layer 18 is patterned into fins by operation of the sidewall spacer masks 70 that are adjacent the insulators 60. After this processing, a fin 18 is positioned adjacent each side of the back gate conductors 50, as shown in FIGS. 8 and 24. This patterning process leaves one side of each fin 18 exposed (e.g., the side that is opposite the back gate conductor 50). Next, in item 312, the invention forms front gate insulators 80 on exposed portions of the fin 18s and then (in item 314) deposits a front gate conductor(s) 90 over the exposed portions of the fins 18 and the insulators 60, 70, 80. This leaves each fin 18 with a front gate conductor 90 on one side of the fin 18 and a back gate conductor 50 on the other side of the fin 18.

The invention simultaneously patterns the back gate conductors 50 and the front gate conductor 90 into linear gate conductors 110 intersecting the fins 18 in item 316 as shown in the top-view diagrams in FIGS. 11 and 27. This process 316 of patterning the back and front gate conductors 50, 90 is selective to the fins 18, such that ends 112 of the fins 18 are exposed after the patterning process. This process of simultaneously patterning the back gate conductors 50 and the front gate conductor 90 automatically aligns the back gate conductors 50 with the front gate conductor 90.

In item 318, the invention then dopes the ends 112 of the fins 18 to form source and drain regions and (in item 320)

forms conductive vias to the front gate conductor(s) (or to a front gate wiring layer) 90 and to a back gate wiring layer 14 (or to a well region 164 electrically connected to the back gate conductors 50). The laminated structure comprises a silicon-on-insulator (SOI) structure and the body voltage level floats because the transistors are insulated by the underlying insulating layer 16. The back gate conductor 50 controls the threshold voltage level of the FinFET by modulating the potential of the channel adjacent to the front gate.

Thus, the invention produces a split-gate fin-type field effect transistor (FinFET) that has parallel fin 18 structures. Each of the fin structures 18 has a source region at one end 112, a drain region at the other end 112, and a channel region 114 in the middle portion. Back gate conductors 50 are positioned between channel regions 114 of alternating pairs of the fin structures 18 and front gate conductors 90 are positioned between channel regions 114 of opposite alternating pairs of the fin structures 18. Thus, the back gate conductors 50 and the front gate conductors 90 are alternatively interdigitated between channel regions of the fin structures 18. Also, each of the channel regions has a back gate conductor 50 on one side of each fin structure 18 and a front gate conductor 90 on the other side of the fin structure 18. The front gate conductors 90 are positioned adjacent to outer sides of channel regions of end fin structures 18 of the split gate FinFET. There are also gate oxides 30, 80 between the back and front gate conductors 90 and the channel regions 114.

A back gate wiring layer 14 or well region 164, is positioned below the fin structures 18. The back gate wiring layer 14 (or well region 164) is electrically connected to the back gate conductor 50. A front gate wiring layer 90 can be positioned above the fin structures 18. The front gate conductors and the front gate wiring layer can comprise a continuous conductive unitary structure 90. Such a front gate wiring layer is electrically connected to, or part of, the front gate conductors. A first conductive via 152 is connected to the back gate wiring layer 14 (or well region 164), and a second conductive via 150 is connected to the front gate wiring layer/front gate conductor(s) 90. A first insulator layer 16 is positioned between the back gate wiring layer 14 and the front gate conductors 90 and a second insulator layer 60, 70 is positioned between the front gate wiring layer 90 and the back gate conductors 50.

Thus, the invention solves a number of problems associated with back-gate-SOI structures by providing a FinFET structure that has self-aligned front and back gates. As mentioned previously, the channel regions in SOI structures are placed above insulators and are therefore floating. Thus, it is important to provide a back gate in SOI structures in order to control the voltage level of the channel region which provides threshold voltage of the transistor. As shown most clearly in FIGS. 15 and 31, the invention utilizes SOI fin channel regions 18 that are electrically insulated above insulating layer 16. In order to control the threshold voltage of the fin channel regions 18, the back gate 50 is placed on one side of the fin channel region 18. The front gate 90 is positioned on the other side of the fin channel region 18.

In FIGS. 11 and 27 (which are top-view of the structures) the front gate 90 and back gate 50 are represented by a single item 110 because the back gate 50 lies directly below the front gate 90. Further, as described above, the front and back gates 110 are patterned simultaneously (e.g., in the same process using the same mask) which provides that the front and back gates will be naturally (automatically) aligned with each other. Note that the front gate and back gate 110 are also used to control the doping of the source/drain regions 112 (wherein the channel region 114 is protected) which allows the gates to be easily and accurately aligned with the source/drain regions.

Thus, this method provides a structure that has front and back gates that are self-aligned with one another and with the source/drain regions. This allows the back gate to control the threshold voltage of transistors even for structures that utilize multiple fins. With such self-alignment, the gate, source, and drain capacitances are all reduced, resulting in reduced power dissipation and reduced circuit delay. The size of the transistor is also reduced, resulting in increased circuit density and decreased manufacturing costs. Low power applications such as cell phones, PDAs, and other mobile products can be fabricated with higher performance and longer battery lifetimes when the invention is utilized.

While the invention has been described in terms of preferred embodiments, those skilled in the art will recognize that the invention can be practiced with modification within the spirit and scope of the appended claims.

What is claimed is:

1. A split-gate fin-type field effect transistor (FinFET) comprising:

a plurality of parallel fin structures;

back gate conductors adjacent said fin structures; and front gate conductors adjacent said fin structures, wherein said back gate conductors and said front gate conductors are alternatively interdigitated between channel regions of said fin structures such that each of said channel regions has a back gate conductor on one side of each fin structure and a front gate conductor on the other side of said fin structure.

2. A split-gate fin-type field effect transistor (FinFET) comprising:

a plurality of parallel fin structures;

back gate conductors between channel regions of alternating pairs of said fin structures;

front gate conductors between channel regions of opposite alternating pairs of said fin structures;

a back gate wiring layer connected to said back gate conductors;

a front gate wiring layer connected to said front gate conductors;

a first insulator layer positioned between said front gate conductors and said back gate wiring layer; and a second insulator layer positioned between said back gate conductors and said front gate wiring layer.

3. The split-gate FinFET in claim 2, further comprising:

a first conductive via connected to said back gate wiring layer; and a second conductive via connected to said front gate wiring layer.

4. The split-gate FinFET in claim 2, wherein said front gate conductors and said front gate wiring layer comprise a continuous conductive unitary structure.

5. The split-gate FinFET in claim 1, wherein ones of said front gate conductors are positioned adjacent to outer sides of channel regions of end fin structures of said split gate FinFET.

6. The split-gate FinFET in claim 1, further comprising gate insulators between said back and font gate conductors and said channel regions.

7. The split-gate FinFET in claim 1, wherein said back gate controls the threshold voltage level of said split-gate FinFET.

8. A split-gate fin-type field effect transistor (FinFET) comprising:
- a plurality of parallel fin structures, wherein each of said fin structures comprises a source region in a first end of said fin, a drain region in a second end of said fin, and a channel region in a middle portion of said fin between said first end and said second end;
- back gate conductors between channel regions of alternating pairs of said fin structures;
- front gate conductors between channel regions of opposite alternating pairs of said fin structures, such that said back gate conductors and said front gate conductors are alternatively interdigitated between channel regions of said fin structures and such that each of said channel regions has a back gate conductor on one side of each fin structure and a front gate conductor on the other side of said fin structure;
- a well region positioned below said fin structures, wherein said well region is electrically connected to said back gate conductors; and
- a front gate wiring layer positioned above said fin structures, wherein said front gate wiring layer is electrically connected to said front gate conductors.

9. The split-gate FinFET in claim 8, further comprising:
- a first insulator layer positioned between said well region and said front gate conductors; and
- a second insulator layer positioned between said front gate wiring layer and said back gate conductors.

10. The split-gate FinFET in claim 8, further comprising:
- a first conductive via connected to said well region; and
- a second conductive via connected to said front gate wiring layer.

11. The split-gate FinFET in claim 8, wherein said front gate conductors and said front gate wiring layer comprise a continuous conductive unitary structure.

12. The split-gate FinFET in claim 8, wherein ones of said front gate conductors are positioned adjacent to outer sides of channel regions of end fin stabs of said split gate FinFET.

13. The split-gate FinFET in claim 8, further comprising gate oxides between said back and front gate conductors and said channel regions.

14. The split-gate FinFET in claim 8, wherein said back gate controls the threshold voltage level of said split-gate FinFET.

15. A split-gate fin-type field effect transistor (FinFET) comprising:
- a plurality of parallel fin structures, wherein each of said fin structures comprises a source region in a first end of said fin, a drain region in a second end of said fin, and a channel region in a middle portion of said fin between said first end and said second end;
- back gate conductors between channel regions of alternating pairs of said fin structures;
- front gate conductors between channel regions of opposite alternating pairs of said fin structures, such that said back gate conductors and said front gate conductors are alternatively interdigitated between channel regions of said fin structures and such that each of said channel regions has a back gate conductor on one side of each fin structure and a front gate conductor on the other side of said fin structure;
- a back gate wiring layer positioned below said fin structures wherein said back gate wiring layer is electrically connected to said back gate conductors; and
- a front gate wiring layer positioned above said fin structures, wherein said front gate wiring layer is electrically connected to said front gate conductors.

16. The split-gate FinFET in claim 15, further comprising:
- a first insulator layer positioned between said back gate wiring layer and said front gate conductors; and
- a second insulator layer positioned between said front gate wiring layer and said back gate conductors.

17. The split-gate FinFET in claim 15, comprising:
- a first conductive via connected to said back gate wiring layer; and
- a second conductive via connected to said front gate wiring layer.

18. The split-gate FinFET in claim 15, wherein said front gate conductors and said front gate wiring layer comprise a continuous conductive unitary structure.

19. The split-gate FinFET in claim 15, wherein ones of said front gate conductors are positioned adjacent to outer sides of channel regions of end fin structures of said split gate FinFET.

20. The split-gate FinFET in claim 15, further comprising gate insulators between said back and front gate conductors and said channel regions.

21. The split-gate FinFET in claim 15, wherein said back gate controls the threshold voltage level of said split-gate FinFET.

* * * * *